United States Patent
Varghese et al.

(10) Patent No.: US 11,056,621 B2
(45) Date of Patent: Jul. 6, 2021

(54) OPTOELECTRONIC DEVICE

(71) Applicant: OSRAM Opto Semiconductors GmbH, Regensburg (DE)

(72) Inventors: Tansen Varghese, Regensburg (DE); David O'Brien, Portland, OR (US); Georg Roßbach, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 36 days.

(21) Appl. No.: 16/332,964

(22) PCT Filed: Sep. 7, 2017

(86) PCT No.: PCT/EP2017/072491
§ 371 (c)(1),
(2) Date: Mar. 13, 2019

(87) PCT Pub. No.: WO2018/050543
PCT Pub. Date: Mar. 22, 2018

(65) Prior Publication Data
US 2019/0259920 A1    Aug. 22, 2019

(30) Foreign Application Priority Data
Sep. 13, 2016  (DE) .......................... 102016117189.1

(51) Int. Cl.
*H01L 33/50* (2010.01)
*H01L 33/62* (2010.01)

(52) U.S. Cl.
CPC .......... *H01L 33/504* (2013.01); *H01L 33/502* (2013.01); *H01L 33/505* (2013.01);
(Continued)

(58) Field of Classification Search
CPC ..... H01L 33/504; H01L 33/505; H01L 33/62; H01L 33/501; H01L 33/26; H01L 33/483;
(Continued)

(56) References Cited

U.S. PATENT DOCUMENTS

| 9,966,503 | B2 | 5/2018 | Strassburg et al. |
| 2006/0113895 | A1* | 6/2006 | Baroky ................. H01L 33/502 313/501 |

(Continued)

FOREIGN PATENT DOCUMENTS

| DE | 102012215421 A1 | 3/2014 |
| DE | 102015106658 A1 | 11/2016 |

(Continued)

*Primary Examiner* — Mouloucoulaye Inoussa
(74) *Attorney, Agent, or Firm* — Slater Matsil, LLP (57) ABSTRACT

An optoelectronic device is disclosed. In an embodiment an optoelectronic device includes a primary radiation source configured to emit an electromagnetic primary radiation during operation of the device and a conversion element arranged in a beam path of the electromagnetic primary radiation, wherein the conversion element includes quantum dots configured to at least partially convert the electromagnetic primary radiation into an electromagnetic secondary radiation during operation of the device, and wherein the quantum dots have a diameter of 50 nm inclusive to 500 nm inclusive.

18 Claims, 3 Drawing Sheets

(52) U.S. Cl.
CPC ............ *H01L 33/62* (2013.01); *H01L 33/501* (2013.01); *H01L 2933/0041* (2013.01); *H01L 2933/0091* (2013.01)

(58) Field of Classification Search
CPC ... H01L 33/60; H01L 31/02322; C09K 11/56; C09K 11/025; C09K 11/883; C09K 11/703; C09K 11/70; C23C 16/45555; C23C 16/403; C23C 16/402; C23C 16/405; B32B 37/144; Y10T 428/2991; Y10T 428/24851; Y10T 156/10; Y10T 428/24335; Y10T 428/24562; F21K 9/56
USPC ................. 438/106, 29, 46; 257/13, 98, 88; 313/501
See application file for complete search history.

(56) References Cited

U.S. PATENT DOCUMENTS

| | | | | |
|---|---|---|---|---|
| 2010/0103648 | A1* | 4/2010 | Kim | H01L 33/507 362/97.1 |
| 2011/0249939 | A1* | 10/2011 | Schmidt | G02B 6/0055 385/39 |
| 2014/0022779 | A1* | 1/2014 | Su | F21V 9/38 362/231 |
| 2014/0326949 | A1* | 11/2014 | Xu | H01L 33/504 257/13 |
| 2015/0028365 | A1* | 1/2015 | Kurtin | C09K 11/025 257/88 |
| 2016/0137916 | A1 | 5/2016 | Wachi | |
| 2017/0005241 | A1* | 1/2017 | Lotito | B82B 3/00 |
| 2018/0022992 | A1* | 1/2018 | Dubrow | C09K 11/56 428/166 |

FOREIGN PATENT DOCUMENTS

| | | |
|---|---|---|
| EP | 2811001 A1 | 12/2014 |
| EP | 2853578 A1 | 4/2015 |
| WO | 2004077580 A2 | 9/2004 |
| WO | 2015091754 A1 | 6/2015 |

* cited by examiner

OPTOELECTRONIC DEVICE

This patent application is a national phase filing under section 371 of PCT/EP2017/072491, filed Sep. 7, 2017, which claims the priority of German patent application 102016117189.1, filed Sep. 13, 2016, each of which is incorporated herein by reference in its entirety.

TECHNICAL FIELD

The invention relates to an optoelectronic device comprising a conversion element.

BACKGROUND

Optoelectronic devices such as, for example, light-emitting diodes (LEDs) often have conversion elements with a converter material. Converter materials convert the primary radiation emitted by a radiation source into a secondary radiation having a changed, for example, longer wavelength. It is known to use quantum dots as converter materials, in order to generate monochromatic or polychromatic light, for example, white light. Quantum dots have numerous advantages compared to conventional converter materials. For example, quantum dots can have a narrow spectral half-width at half the height of the maximum (FWHM; full width half maximum) of the emitted radiation. In addition, by using quantum dots, it is possible to vary the peak wavelength of the emission radiation very easily. In order to increase the absorption of the primary radiation emitted by the radiation source and the light emission of the quantum dots, the layer thickness of the conversion element and the concentration of converter particles are usually increased and scattering particles such as, for example, $TiO_2$ particles are introduced into the conversion element. The previously best optical properties in light-emitting diodes are achieved with cadmium-containing quantum dots. In particular, the increase in the concentration of cadmium-containing quantum dots is problematic, as they must not be used in any desired concentration due to the toxicity of the cadmium.

SUMMARY OF THE INVENTION

Embodiments provide an optoelectronic device having a conversion element comprising quantum dots having an efficiency-improved conversion process or having higher material efficiency. An improved material efficiency is understood in particular to mean the same energy efficiency and the same degree of conversion by using a lower concentration of quantum dots than conventionally.

Embodiments of the invention relate to an optoelectronic device. The optoelectronic device comprises a primary radiation source, which is designed to emit an electromagnetic primary radiation during operation of the device. In addition, the optoelectronic device comprises a conversion element which is arranged in the beam path of the electromagnetic primary radiation. The conversion element comprises quantum dots which are designed to convert the electromagnetic primary radiation at least partially into an electromagnetic secondary radiation during operation of the device. The quantum dots have a diameter of 50 nm inclusive to 500 nm inclusive, preferably from 100 nm inclusive to 500 nm inclusive, particularly preferably from 120 nm inclusive to 500 nm.

By definition, the quantum dots comprise a core and a shell, surrounding the core, or consist of a core and a shell. The diameters of the quantum dots specified here and below therefore relate to the diameter of the quantum dots including the core and the shell.

According to one embodiment, the quantum dots have a spherical or almost spherical geometry.

In particular, all quantum dots have a diameter of 50 nm inclusive to 500 nm inclusive, preferably from 100 nm inclusive to 500 nm inclusive, particularly preferably from 120 nm inclusive to 500 nm, for example, 200 nm. Deviations of +/−10%, preferably +/−5%, particularly preferred +/−2% are included by definition.

Usually, quantum dots with a core and a shell in a conversion element of an optoelectronic device have a diameter below 30 nm. The primary radiation can be effectively scattered at the quantum dots by selecting the diameter of the quantum dots from 50 nm inclusive to 500 nm inclusive, increasing the probability of absorption by the existing quantum dots. As a result, the light yield of secondary radiation emitted by the optoelectronic device is enhanced, thus the efficiency of the device is increased. Alternatively, while maintaining the efficiency, the quantity of quantum dots in the conversion element can be reduced. In addition, the elastic scattering is increased and thus the more or less random change in direction of the primary and secondary radiation is increased, which leads to improved efficiency. Due to the light scattering of the primary and secondary radiation, a homogeneity of the radiated light is also achieved. The selection of the diameter of the quantum dots from 50 nm inclusive to 500 nm inclusive advantageously allows the addition of additional scattering particles to be avoided. Quantum dots having a diameter below 50 nm show an insufficient scattering effect and below 30 nm almost no or a negligible scattering effect.

The fact that the quantum dots convert the electromagnetic primary radiation at least partially into an electromagnetic secondary radiation can, on the one hand, mean that the electromagnetic primary radiation is at least partially absorbed by the quantum dots and is emitted as secondary radiation with a wavelength range which is at least partially different from the primary radiation. Part of the absorbed primary radiation is also emitted as heat from the quantum dots. The electromagnetic primary radiation and electromagnetic secondary radiation can have one or more wavelengths and/or wavelength ranges in an infrared to ultraviolet wavelength range, in particular in a visible wavelength range.

The fact that the quantum dots at least partially convert the electromagnetic primary radiation into an electromagnetic secondary radiation can also mean that the electromagnetic primary radiation is almost completely absorbed by the quantum dots and is emitted in the form of an electromagnetic secondary radiation and in the form of heat. The emitted radiation of the optoelectronic device according to this embodiment thus corresponds almost completely to the electromagnetic secondary radiation. Almost complete conversion is understood to mean a conversion of more than 90%, in particular over 95%.

It is possible for the device to emit mixed radiation from primary radiation and secondary radiation, which gives a white-colored luminous impression to the observer.

According to at least one embodiment, the primary radiation source is a layer sequence having an active layer, which is designed to emit an electromagnetic primary radiation during operation of the device. The layer sequence can be a semiconductor device, for example, a light-emitting diode.

In this context, "layer sequence" is understood to mean a layer sequence comprising more than one layer, for example, a series of a p-doped semiconductor layer and a n-doped semiconductor layer, wherein the layers are arranged, for example, one above the other and wherein at least one active layer is contained which emits electromagnetic primary radiation.

The layer sequence can be designed as an epitaxial layer sequence or as a radiation-emitting semiconductor chip having an epitaxial layer sequence that is to say as an epitaxially grown semiconductor layer sequence. In this case, the layer sequence can be based on, for example, InGaAlN. InGaAlN-based semiconductor chips and semiconductor layer sequences are in particular those, in which the epitaxially produced semiconductor layer sequence has a layer sequence composed of different individual layers, which layer sequence contains at least one individual layer, which comprises a material from the III-V compound semiconductor material system $In_xAl_yGa_{1-x-y}N$ where $0 \le x \le 1$, $0 \le y \le 1$ and $x+y \le 1$. Semiconductor layer sequences which have at least one active layer based on InGaAlN, can emit, for example, electromagnetic primary radiation in an ultraviolet to green wavelength range. In particular, an ultraviolet or blue, preferably a primary radiation in the blue wavelength range, for example, of 450 nm, is emitted.

The active semiconductor layer sequence can comprise, in addition to the active layer, further functional layers and functional regions, for example, p- or n-doped charge carrier transport layers, that is to say electron or hole transport layers, un- or p-doped or p-doped or n-doped confinement, cladding or waveguide layers, barrier layers, planarization layers, buffer layers, protective layers and/or electrodes and combinations thereof. Furthermore, for example, one or more mirror layers can be applied on a side of the semiconductor layer sequence facing away from the growth substrate. The structures described here, the active layer or the further functional layers and regions are in particular known to the person skilled in the art with regard to composition, function and structure and are therefore not explained in more detail here.

According to at least one embodiment, the quantum dots have a core and a shell. The core is designed to absorb the primary radiation, in particular with high quantum efficiency, and to emit a secondary radiation. The core can have a diameter of 1 nm inclusive to 20 nm inclusive, preferably 1 nm inclusive to 10 nm inclusive, particularly preferably from 2 nm inclusive to 8 nm inclusive, and the shell can have a thickness of 15 nm inclusive to 249.5 nm inclusive, preferably from 20 nm inclusive to 249.5 nm inclusive, particularly preferably from 21 nm inclusive to 249 nm inclusive. Overall, the quantum dots have a diameter of 50 nm inclusive to 500 nm inclusive. In the case of such thicknesses of the shell, the cores of the quantum dots are sufficiently insulated from one another in order to ensure an optimum conversion process. The physical contact between two cores of quantum dots is unfavorable for the conversion process that is to say, for the absorption of the primary radiation and the avoidance of high reabsorption of the secondary radiation. In the case of larger thicknesses of the shell, the transport properties of charge carriers from the shell to the core are negatively influenced.

The shell is designed, on the one hand, to transport the charge carriers into the core from or through the shell and, on the other hand, to serve as an electronic barrier for the charge carriers, so that they can no longer be transported from the core to the surface of the shell. On the other hand, the shell is used to passivate non-radiating charge carrier recombination paths on the core surface by avoiding free bonds (so-called "dangling bonds") of the core material.

According to at least one embodiment, the shell completely surrounds the core. This means that the surface of the core is completely covered by the shell. In particular, the core and the shell have direct contact with one another.

According to at least one embodiment, the core comprises a semiconductor material, preferably a II/VI, IV/VI, III/V, $II_3/V_2$, $I/III/VI_2$, IV or $I_2/VI$ semiconductor material or consists of the semiconductor material, preferably a II/VI or III/V semiconductor material. The peak wavelength or the emission wavelength of the secondary radiation is determined by the material of the core and/or the diameter of the core.

According to at least one embodiment, the core comprises CdSTe, CdSeTe, CdHgTe, HgTe, PbS, PbSSe, PbSe, PbTe, CuInP, InPAs, InAs, $Cd_3P_2$, $Cd_3As_2$, $CuInS_2$, $CuInSe_2$, $AgInS_2$, Ge, $Ag_2S$, $Ag_2Se$, $Ag_2Te$, InP, CdS, CdSe, InGaAs, InGaP, InGaSb, CdTe, InGaN oder $CuInSe_2$, preferably CdSTe, CdSeTe, CdHgTe, $Cd_3P_2$, $Cd_3As_2$ CdS, CdSe, CdTe or alloys of these materials or consists of these materials or of alloys of these materials.

According to at least one embodiment, the shell comprises a material or consists of a material, which has a higher band gap than the material of the core. As a result, the charge carriers can be held in the core, because due to the higher band gap of the material of the shell they are not transported into the shell (so-called "carrier confinement"). Thus, a radiating recombination of the charge carriers within the core takes place and thus a high radiative efficiency.

In addition, the moisture-sensitive and oxygen-sensitive core can be efficiently protected from these influences by the shell. In particular, the material of the shell is dielectric.

According to at least one embodiment, the shell comprises at least one first shell, which comprises a semiconductor material or an insulator, preferably ZnS, ZnSe, CdS, ZnTe, AlGaAs, GaN, $SiO_2$, $Al_2O_3$, $Si_3N_4$ or $TiO_2$ or consists of one of these materials. ZnS, ZnSe, CdS, ZnTe, AlGaAs and GaN are semiconductor materials and $SiO_2$, $Al_2O_3$, $Si_3N_4$ and $TiO_2$ are insulators. The shell can also consist of the first shell. By selecting these materials of the first shell, chemical bonds can in particular be formed between the semiconductor material of the core on the surface thereof to the material of the shell or first shell. As a result, no or virtually no free bonds are present on the surface of the core, on which non-radiative recombination of charge carriers could take place. The first shell thus serves to passivate non-radiating charge carrier recombination paths on the core surface by avoiding free bonds of the semiconductor material of the core.

According to at least one embodiment, the first shell has a thickness of between 15 nm inclusive and 50 nm inclusive. In the case of these thicknesses of the first shell, the first shell, in addition to the core, contributes in particular to the absorption of the primary radiation. Particularly in the case of these thicknesses of the first shell, the charge transport of charge carriers from the shell to the core is particularly effective.

According to at least one embodiment, the shell comprises a second shell. According to this embodiment, the shell comprises a first and a second shell. The shell can also consist of the first and the second shell.

According to at least one embodiment, the conversion element comprises a matrix material. The matrix material can be, for example, a silicone, a poly(methyl methacrylate) or an epoxy resin.

According to at least one embodiment, the quantum dots in the matrix material are distributed homogeneously or almost homogeneously. The homogeneous distribution contributes to an improvement in the absorption and to a reduction in the reabsorption of the secondary radiation.

If the shell consists of the first shell, the material of the first shell has a material which has a refractive index $n_D^{20}$, which is smaller or larger than that of the matrix material, in order to ensure a scattering of the radiation.

The second shell can comprise a material or consist of a material which has a refractive index $n_D^{20}$, which is smaller or larger, preferably larger than that of the matrix material. For example, $MgF_2$ having a refractive index of $n_D^{20}$ 1.36 can be used as material for the second shell, if, for example, a silicone having a refractive index of 1.5 is used as the matrix material.

Materials having a refractive index different from the matrix material and a low absorption at the primary radiation and secondary radiation wavelengths can be used as the material for the second shell. Materials having a low extinction (absorption) are, for example, metal oxides, insulators and semiconductors having a larger band gap than the wavelength of the primary and/or secondary radiation.

According to at least one embodiment, the first shell is arranged above the core and the second shell is arranged above the first shell.

According to at least one embodiment, the first shell completely surrounds the core and the second shell completely surrounds the first shell. In particular, the core and the first shell and the first shell and the second shell have direct contact with one another.

According to at least one embodiment, the core is bonded to the first shell and/or the first shell is bonded to the second shell by chemical bonds.

If the first shell contributes to the absorption of the primary radiation, thus, if the first shell has a layer thickness of between 15 nm inclusive and 50 nm inclusive, the material of the second shell preferably has good passivation properties in order to prevent recombination of the charge carriers on the surface of the first shell. Preferably, chemical bonds are formed between the material of the first shell and the material of the second shell on the surface of the first shell. As a result, no or virtually no free bonds are present on the surface of the first shell, on which non-radiative recombination of charge carriers could take place. The second shell thus serves to passivate non-radiating charge carrier recombination paths on the surface of the first shell by avoiding free bonds of the material of the first shell. In addition, the second shell serves to increase the scattering without impairing the electrical properties.

According to at least one embodiment, the material of the second shell is a metal halide, a metal oxide or a metal phosphite.

According to at least one embodiment, the material of the second shell is selected from a group comprising $TiO_2$, $SiO_2$, $Al_2O_3$, $MgF_2$, $Hf_2O_5$, $Nb_2O_5$, $Ta_2O_5$, $ZrO_2$, GaN, $Si_3N_4$ and GaP. Preference is given to $TiO_2$ and/or $Al_2O_3$. These materials exhibit in particular a low absorption at the primary radiation and secondary radiation wavelengths.

According to at least one embodiment, the second shell can consist of a plurality of partial shells, in particular of two partial shells. Preferably, the first and the second partial shells consist of different materials. For example, the first partial shell consists of $TiO_2$ having a refractive index $n_D^{20}$ of 2.4 and the second partial shell consists of $Al_2O_3$ having a refractive index $n_D^{20}$ of 1.7 to 1.8. The first partial shell can preferably completely surround the first shell and the second partial shell can surround the first partial shell. In particular, the first shell and the first partial shell and the first partial shell and the second partial shell have direct contact with one another.

According to at least one embodiment, the core has a diameter of 1 nm inclusive to 20 nm inclusive, preferably from 1 nm inclusive to 10 nm inclusive, particularly preferably from 2 nm inclusive to 8 nm inclusive, and the shell consisting of the first shell and the second shell has a thickness of 15 nm inclusive to 249.5 nm inclusive, preferably from 20 nm inclusive to 249.5 nm inclusive, particularly preferably from 21 nm inclusive to 249 nm inclusive. The first shell can have a thickness of 2 nm inclusive to 150 nm inclusive, preferably between 15 nm inclusive and 50 nm inclusive, and the second shell has a thickness of 20 nm inclusive to 150 nm inclusive. Overall, the quantum dots have a diameter of 50 nm inclusive to 500 nm inclusive. With such a thickness, the first shell ensures good electrical transport properties of charge carriers from the first shell to the core and the second shell provides good scattering properties with such thicknesses.

According to at least one embodiment, the quantum dots comprise first and second quantum dots. For example, the diameter of the core, the material of the core, the material of the shell, the thickness of the shell and/or the diameter of the first and second quantum dots differ from one another.

When using first and second quantum dots having different diameters, which is between 50 nm inclusive and 500 nm inclusive, the optimum scattering effect can be set for a blue primary radiation and a secondary radiation in the green to red range of the electromagnetic spectrum. It has been found that the scattering of blue light at a given diameter of the quantum dots is greater than that for green and red light. The scattering of the blue primary radiation can be adjusted by varying the diameters of the quantum dots, so that the primary radiation is efficiently absorbed by the quantum dots. Furthermore, the scattering of the secondary radiation can be optimized by a suitable selection of the diameter of the quantum dots, so that the secondary radiation is efficiently decoupled from the conversion element.

In particular, for example, the first quantum dots can have a diameter of 50 nm inclusive to 80 nm inclusive and the second quantum dots can have a diameter of 80 nm to 100 nm inclusive. The larger the diameter of the quantum dots, the greater the scattering effect.

The scattering of the primary radiation for an efficient absorption and/or the scattering of the secondary radiation for an efficient decoupling of light can also be adapted by optimizing the refractive indices and/or the extinction coefficients of the materials of the quantum dots, in particular of the materials of the shell.

The optoelectronic device can comprise a housing. A recess can be provided in the center of the housing. The primary radiation source can be mounted in the recess. It is also possible for the recess to be filled with a casting covering the primary radiation source. However, the recess can also consist of an air space.

According to at least one embodiment, the conversion element is designed as a platelet arranged above the primary radiation source. The platelet can be in direct mechanical contact with the primary radiation source or be arranged at a distance therefrom.

The layer thickness of the entire platelet can be uniform. Thus, a constant color location can be achieved over the entire surface of the platelet. For example, the layer thickness is between 500 nm and 500 μm.

According to at least one embodiment, the platelet can be applied directly to the primary radiation source. It is possible for the platelet to cover the entire surface of the primary radiation source.

In one embodiment, the platelet is arranged above the recess of the housing. In this embodiment of the conversion element, there is no direct and/or positive contact between the conversion element and the primary radiation source. That is to say that a distance can exist between the conversion element and the primary radiation source. In other words, the conversion element is subordinate to the primary radiation source and is irradiated by the primary radiation. A casting or an air gap can then be formed between the conversion element and the primary radiation source.

According to at least one embodiment, an adhesive layer is arranged between the primary radiation source and the platelet or between the platelet and the housing. In addition, an adhesive layer can be arranged between the platelet and the casting.

The fact that a layer or an element "is arranged between two other layers or elements" can mean here and below that the one layer or the one element is arranged directly in direct mechanical and/or electrical contact or in indirect contact with one of the two other layers or elements and in direct mechanical and/or electrical contact or electrically or in indirect contact with other layers or elements. In the case of indirect contact, further layers and/or elements can then be arranged between the one and at least one of the two other layers or between the one and at least one of the two other elements.

It is possible for the platelet to be produced separately and to be applied to the primary radiation source. In this case, an adhesive layer can be applied to fix the platelet to the layer sequence or to the housing.

In one embodiment, the adhesive layer comprises a silicone or consists of a silicone.

In one embodiment, the platelet is produced directly on the primary radiation source or the housing. This proves to be advantageous in particular in the case of platelets having small layer thicknesses.

In one embodiment, the conversion element is part of a casting of the primary radiation source, for example, the layer sequence or the conversion element forms the casting.

In one embodiment, the conversion element is designed as a layer. The layer can be arranged above the radiation emitting surface of the primary radiation source or above the radiation emitting surface and the side surfaces of the primary radiation source.

The optoelectronic device can be a light-emitting diode (LED).

BRIEF DESCRIPTION OF THE DRAWINGS

Further advantageous embodiments and developments of the invention result from the exemplary embodiments described below in conjunction with the figures.

In the exemplary embodiments and figures, identical or identically acting components are each provided with the same reference symbols. The elements illustrated and their size relationships among one another are not to be regarded as true to scale. Rather, individual elements, in particular layer thicknesses, can be represented with an exaggerated size for a better understanding.

DETAILED DESCRIPTION OF ILLUSTRATIVE EMBODIMENTS

Figure 1:
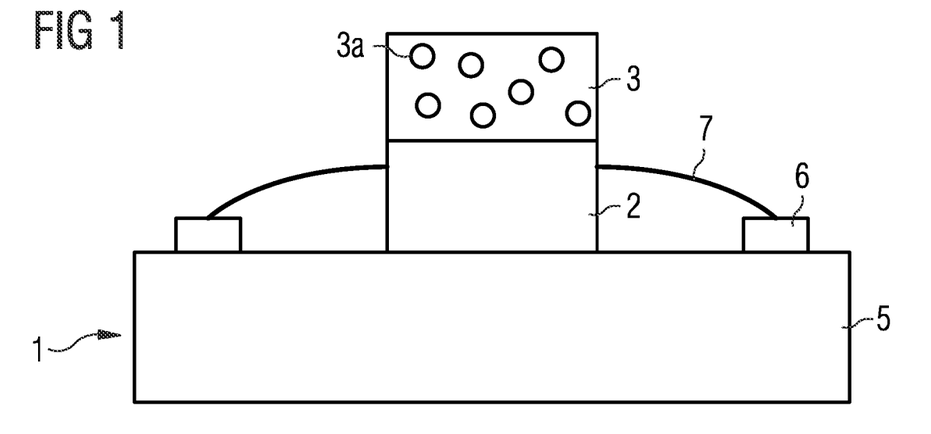
FIGS. 1 and 2 show schematic side views of different embodiments of optoelectronic devices.

The optoelectronic device 1 according to FIG. 1 shows a substrate 5 having a lead frame 6. A layer sequence 2 is arranged on the substrate 5, which is electrically connected to the lead frame 6 via bonding wires 7. A conversion element 3 in the form of a platelet is attached above the layer sequence 2. The conversion element 3 comprises quantum dots $3a$ and a matrix material, wherein the quantum dots $3a$ are homogeneously distributed in the matrix material. For example, the matrix material is a silicone. The quantum dots $3a$ have, for example, a core of CdSe and a first shell of CdS. The quantum dots have a diameter of 80 nm. The core 9 has a diameter of 4 nm and the shell has a thickness of 38 nm. The platelet is arranged in the beam path of the electromagnetic primary radiation emitted by an active layer (not shown separately here) in the layer sequence 2. By selecting the diameter of the quantum dots $3a$, the primary radiation can be effectively scattered at the quantum dots. As a result of the effective scattering of the primary radiation at the quantum dots $3a$, the absorption probability of the primary radiation is increased by the quantum dots $3a$ and thus the yield of secondary radiation. In addition, the secondary radiation emitted by the quantum dots $3a$ is scattered by the quantum dots $3a$, so that it can be effectively decoupled to the outside environment. According to embodiments of the invention, the quantum dots $3a$ thus serve as scattering particles for effective scattering of the primary radiation and also of the secondary radiation and for the conversion of the primary radiation. In this way, fewer quantum dots $3a$ than conventionally can be used to achieve a desired light yield. The concentration of quantum dots $3a$ can thus be kept low. This is particularly important in the case of cadmium-containing quantum dots, since the cadmium concentration must not exceed certain limit values according to the provisions of the REACH and the ROHS. By means of the shell, it can be avoided that the nuclei of the quantum dots $3a$ come spatially close to one another, which would result in energy losses due to non-radiative processes. In addition, the shell serves to suppress non-radiative recombination of charge carriers on the surface of the core (passivation). In addition, the quantum dots $3a$ are protected from moisture and oxygen by the shell. This also prevents an early failure of the optoelectronic device 1 and extends the service life of the optoelectronic device 1.

In addition, an adhesive layer (not shown here) can be applied between the layer sequence 2 and the conversion element 3. The adhesive layer can, for example, comprise or consist of silicone. It is possible for the silicone of the adhesive layer to correspond to the silicone of the matrix material of the conversion element 3.

The optoelectronic device is preferably an LED, wherein the radiation is decoupled upwards via a transparent semiconductor layer sequence 2 and the conversion element 3.

Figure 2:
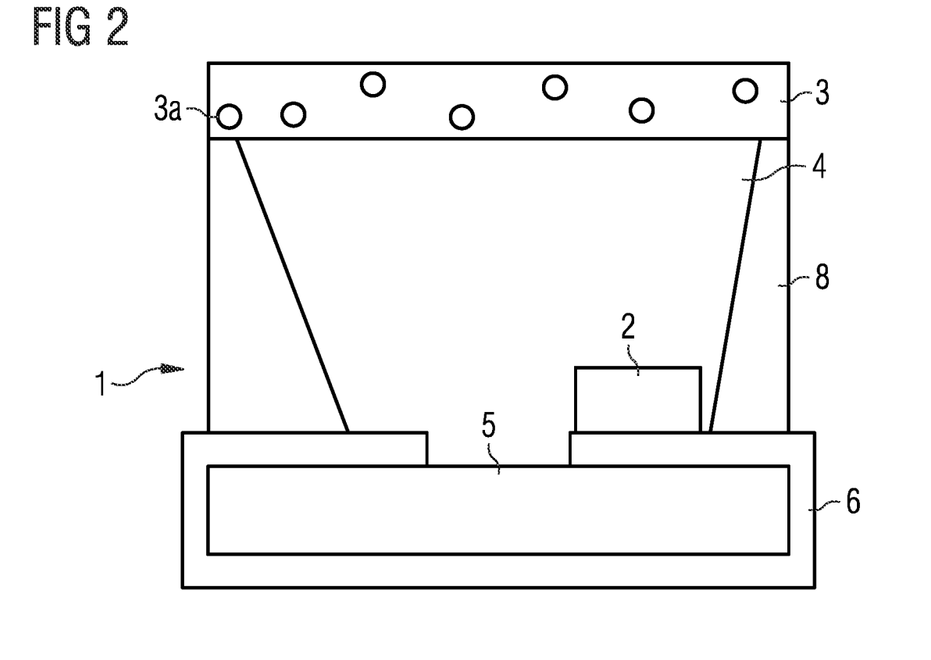

The optoelectronic device 1 according to FIG. 2 shows a substrate 5 having a lead frame 6 and a housing 8. The housing 8 has a recess in the center, in which the layer sequence 2 is arranged, which is electrically conductively connected to the lead frame 6. The recess is filled with a casting 4. The casting 4 comprises, for example, a silicone.

A conversion element 3 is arranged above the recess of the housing 8 and the housing 8. The conversion element 3 is designed in the form of a platelet and is arranged in the beam path of the electromagnetic primary radiation, which is emitted by an active layer (not shown separately here) in the layer sequence 2.

The conversion element 3 comprises quantum dots 3a and a silicone as matrix material, wherein the quantum dots 3a are homogeneously distributed in the silicone. The quantum dots 3a have, for example, a core made of InP, a first shell of GaP and a second shell of $ZrO_2$. The silicone has a different refractive index than the $ZrO_2$ of the second shell. As a result, the primary and secondary radiation can be efficiently scattered.

Figure 3:
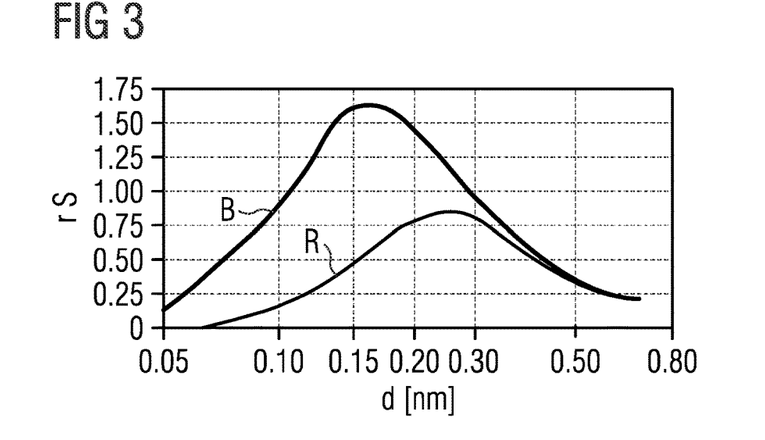
FIG. 3 shows the influence of the diameter of titanium dioxide particles on the scattering properties.

FIG. 3 shows the influence of the diameter of titanium dioxide particles on the scattering properties. The y-axis shows the relative scattering efficiency (rS) and the x axis shows the diameter of $TiO_2$ particles in nanometers. As can be seen, blue light (B) is scattered more strongly at a given particle diameter than red light (R). The scattering efficiency of green light (not shown) is between that of blue and red light.

Figure 4A:
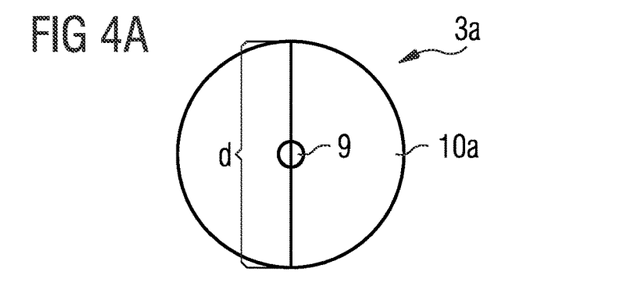
FIGS. 4A, 4B and 4C show quantum dots.

FIG. 4A shows a quantum dot 3a. It has a core 9, for example, of CdSe, and a first shell 10a made of CdS. The quantum dots 3a have a diameter d of 50 nm inclusive to 500 nm inclusive, for example, 70 nm. The core 9 has a diameter of 1 nm inclusive to 20 nm inclusive and the first shell 10a has a thickness of 15 nm inclusive to 249.5 nm inclusive.

Figure 4B:
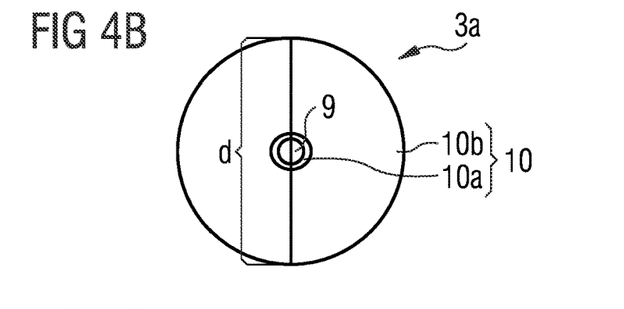

FIG. 4B shows a quantum dot 3a. It has a core 9, for example, of CdSe, a first shell 10a made of CdS and a second shell made of $TiO_2$. The quantum dots 3a have a diameter d of 50 nm inclusive to 500 nm inclusive, for example, 120 nm. The core 9 has a diameter of 1 nm inclusive to 20 nm inclusive and the shell 10 has a layer thickness of 25 nm inclusive to 249.5 nm inclusive. The first shell 10a has a thickness of 2 nm inclusive to 150 nm inclusive. With such a thickness, the first shell ensures good electrical transport properties of charge carriers from the first shell to the core and the second shell provides good scattering properties of the quantum dots with such thicknesses.

Figure 4C:
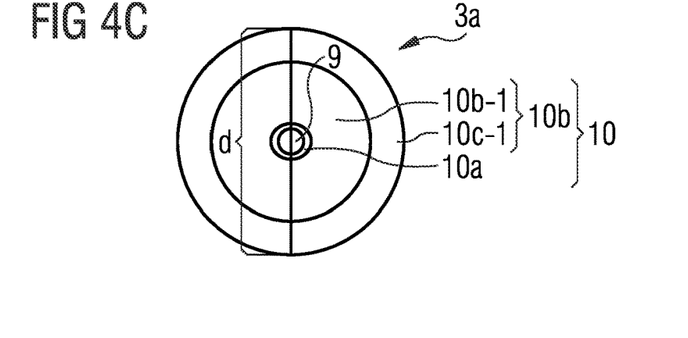

FIG. 4B shows a quantum dot 3a. It has a core 9, for example, of CdSe, a first shell 10a made of CdS and a second shell. The second shell 10b has a first partial shell 10b-1 made of $TiO_2$ and a second partial shell 10b-1 made of $Al_2O_3$. The quantum dots 3a have a diameter d of 50 nm inclusive to 500 nm inclusive. The core 9 has a diameter of 1 nm inclusive to 20 nm inclusive and the shell 10 has a layer thickness of 15 nm inclusive to 249.5 nm inclusive. The first shell 10a has a thickness of 15 nm inclusive to 150 nm inclusive.

Figure 5A:
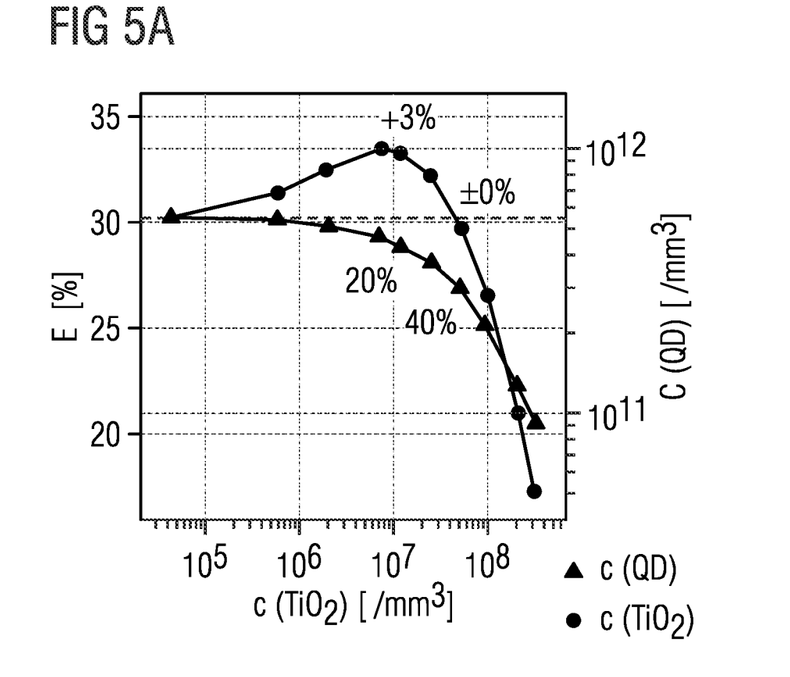
FIG. 5A shows the relative efficiency as a function of the concentration of titanium dioxide particles or the concentration of conventional quantum dots.
Figure 5B:
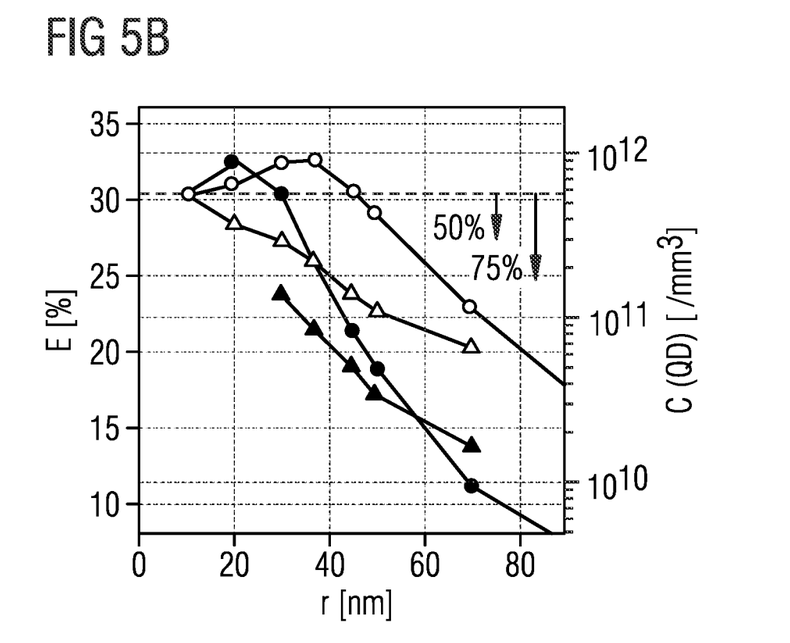
FIG. 5B shows the relative efficiency as a function of the radius of the quantum dots and the concentration of the quantum dots.

The diagrams of FIGS. 5A and 5B were simulated with the program "LightTools". The optoelectronic devices on which the simulation is based have a conventional housing with a semiconductor chip, which emits a primary radiation of 450 nm (volume emitting sapphire chip; $I_{blau}/I_{rot}$<0.01; Cx=0.69). A full conversion of the primary radiation is assumed. The scattering properties of the $TiO_2$ particles or of the quantum dots were calculated on the basis of the mie scattering theory for assumed homogeneous spherical particles in a matrix material made of high-refractive silicone having a refractive index $n_D^{20}$ of 1.53. The assumed refractive index of the quantum dots, which consists of a core, of a first and a second shell, corresponds to an averaged refractive index of the materials of the quantum dots. This approximation of the refractive index of the quantum dots is justified, since the diameter of the quantum dots is much smaller than the wavelength of the light. The diameter of the quantum dots up to and including the first shell, was assumed to be 20 nm in this simulation. The absorptions, except for that of the first shell of CdS (absorption known from the literature), were disregarded. The results can only be achieved if the particle sizes, as in the simulation, are significantly smaller than the wavelength of the light. The given relative efficiency relates to the emitted power of the semiconductor chip at 450 nm.

The diagram of FIG. 5A relates to a conventional device having a conversion element, in which $TiO_2$ particles having a diameter of 200 nm and quantum dots having a diameter of 10 nm are homogeneously distributed in a matrix material made of highly refractive silicone. It can be seen that the relative efficiency e initially increases with the concentration of $TiO_2$ particles (c($TiO_2$)) until an optimum concentration (about 107 $TiO_2$ particles per mm$^3$) is reached, which results from an interaction between an increased optical decoupling, backscattering and reabsorption. As a result of the scattering of the primary radiation on the $TiO_2$ particles, the primary radiation on average covers a longer path in the conversion element, which increases the probability of absorption by the quantum dots. At the optimum concentration of $TiO_2$ particles, approximately 20% less conventional quantum dots can be used compared to a conversion element without $TiO_2$ particles while increasing the efficiency by about 3%. An increase in the concentration of the quantum dots would lead to an efficiency drop due to backscattering and losses of the internal quantum efficiency caused by reabsorption. The internal quantum efficiency is to be understood as the number of emitted photons of the secondary radiation per number of absorbed photons of the primary radiation. The internal quantum efficient thus describes the loss of charge carriers by non-radiative recombination in addition to the absorption of the primary radiation and the emission of the secondary radiation. The losses of the internal quantum efficiency can be further increased by reabsorption processes of the secondary radiation. The efficiency of this device can be maintained by the presence of the $TiO_2$ particles, if approximately 40% of less conventional quantum dots are used compared to a conversion element without $TiO_2$ particles.

The diagram of FIG. 5B relates to an optoelectronic device having a conversion element in which quantum dots having a different radius (r) are homogeneously distributed in a matrix material made of high-refractive silicone having a refractive index $n_D^{20}$ of 1.53. The radius corresponds to half the diameter. The quantum dots have a core, a first shell made of CdS and a second shell made of $TiO_2$ having a refractive index $n_D^{20}$ of 2.4 (filled circles, filled triangles) or $Al_2O_3$ having a refractive index $n_D^{20}$ of 1.8 (open circles, open triangles). Since the diameter of the core is very small compared to the thickness of the first shell, a CdS core is also assumed. The quantum dots serve as scattering and converter particles. The concentration of scattering and converter particles is thus identical in the device. An additional degree of freedom is produced by varying the thickness of the second shell and thus of the diameter of the quantum dots. Since the scattering and converter particles are the same quantum dots, each scattering of primary radiation can also lead to a conversion, which is not the case with separate scattering and converter particles. By increasing the efficiency by about 3%, approximately 50% of the quantum dots can be used in comparison to a conversion element having conventional quantum dots, which have a diameter of less than 20 nm. The efficiency of this device can be preserved compared to a device having conventional quantum dots, if approximately 75% fewer quantum dots are used. In comparison to the device described under 5A, this means a saving of quantum dots by a factor of 2. This can be an essential criterion for the devices in order to bring them on the market at all, in particular with regard to legal restrictions such as REACH or ROHS when using quantum dots containing Cd.

The invention is not restricted by the description on basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. An optoelectronic device comprising:
a primary radiation source configured to emit electromagnetic primary radiation; and
a conversion element arranged in a beam path of the electromagnetic primary radiation,
wherein the conversion element comprises quantum dots, comprising a core and a shell, configured to at least partially convert the electromagnetic primary radiation into electromagnetic secondary radiation,
wherein the quantum dots have a diameter of 50 nm inclusive to 500 nm inclusive,
wherein the shell comprises a first and a second shell,
wherein the first shell completely surrounds the core and the second shell completely surrounds the first shell,
wherein the core and the first shell have direct contact with one another,
wherein the first shell and the second shell have direct contact with one another,
wherein the core is bonded to the first shell by chemical bonds such that virtually no free bonds are present on a surface of the core,
wherein the first shell is bonded to the second shell by chemical bonds such that virtually no free bonds are present on a surface of the first shell,
wherein the second shell consists of two partial shells,
wherein a second partial shell surrounds a first partial shell,
wherein the first shell and the first partial shell have direct contact with one another,
wherein the first partial shell and the second partial shell have direct contact with one another,
wherein the first partial shell consists essentially of $TiO_2$, and
wherein the second partial shell consists essentially of $Al_2O_3$.

2. The optoelectronic device according to claim 1, wherein the core has a diameter of 1 nm inclusive to 20 nm inclusive and the shell has a thickness of 15 nm inclusive to 249.5 nm inclusive.

3. The optoelectronic device according to claim 1, wherein the core comprises a II/VI, IV/VI, III/V-$II_3$/$V_2$, I/III/$VI_2$, IV or $I_2$/VI semiconductor material.

4. The optoelectronic device according to claim 1, wherein the shell comprises a material having a higher band gap than a material of the core.

5. The optoelectronic device according to claim 1, wherein the first shell comprises ZnS, ZnSe, CdS, ZnTe, AlGaAs, GaN, $SiO_2$, $Al_2O_3$, $Si_3N_4$ or $TiO_2$.

6. The optoelectronic device according to claim 1, wherein the core comprises CdSTe, CdSeTe, CdHgTe, HgTe, PbS, PbSSe, PbSe, PbTe, CuInP, InPAs, InAs, $Cd_3P_2$, $Cd_3As_2$, $CuInS_2$, $CuInSe_2$, $AgInS_2$, Ge, $Ag_2S$, $Ag_2Se$, $Ag_2Te$, InP, CdS, CdSe, InGaAs, InGaP, InGaSb, CdTe, InGaN, $CuInSe_2$ or alloys of these materials.

7. The optoelectronic device according to claim 1, wherein the conversion element comprises a matrix material.

8. The optoelectronic device according to claim 7, wherein the second shell comprises a material having a refractive index nD20 larger than the matrix material.

9. The optoelectronic device according to claim 8, wherein the first shell is bonded to the second shell with chemical bonds.

10. The optoelectronic device according to claim 9, wherein the core has a diameter of 1 nm inclusive to 20 nm inclusive, and wherein the first shell has a thickness of 2 nm inclusive to 150 nm inclusive and the second shell has a thickness of 20 nm inclusive to 150 nm inclusive.

11. The optoelectronic device according to claim 1, wherein the conversion element is formed as a platelet above the primary radiation source.

12. An optoelectronic device comprising:
a primary radiation source configured to emit electromagnetic primary radiation; and
a conversion element arranged in a beam path of the electromagnetic primary radiation,
wherein the conversion element comprises quantum dots comprising a core and a shell configured to at least partially convert the electromagnetic primary radiation into electromagnetic secondary radiation,
wherein the quantum dots have a diameter of 120 nm inclusive to 500 nm inclusive,
wherein the core has a diameter of 2 nm inclusive to 8 nm inclusive,
wherein the core comprises CdSTe, CdSeTe, CdHgTe, $Cd_3P_2$, $Cd_3As_2$ CdS, CdSe, CdTe or alloys of these materials,
wherein the shell comprises a first shell and a second shell,
wherein the first shell completely surrounds the core and the second shell completely surrounds the first shell,
wherein the core and the first shell have direct contact with one another,
wherein the first shell and the second shell have direct contact with one another,
wherein the first shell comprises ZnS, ZnSe, CdS, ZnTe, AlGaAs, GaN, $SiO_2$, $Al_2O_3$, $Si_3N_4$ or $TiO_2$,
wherein the first shell has a thickness of between 15 nm inclusive and 50 nm inclusive,
wherein the second shell has a thickness of 20 nm inclusive to 150 nm inclusive,
wherein the core is bonded to the first shell by chemical bonds such that virtually no free bonds are present on a surface of the core,
wherein the first shell is bonded to the second shell by chemical bonds such that virtually no free bonds are present on a surface of the first shell,
wherein the second shell consists of two partial shells,
wherein a second partial shell surrounds a first partial shell,
wherein the first shell and the first partial shell have direct contact with one another,
wherein the first partial shell and the second partial shell have direct contact with one another,
wherein the first partial shell consists essentially of $TiO_2$, and wherein the second partial shell consists essentially of $Al_2O_3$.

13. The optoelectronic device according to claim 1, wherein the conversion element is formed as a casting arranged above the primary radiation source.

14. The optoelectronic device according to claim 1, wherein the core comprises CdSTe, CdSeTe, CdHgTe, $Cd_3P_2$, $Cd_3As_2$ CdS, CdSe, CdTe or alloys of these materials.

15. The optoelectronic device according to claim 14, wherein the first shell comprises ZnS, ZnSe, CdS, ZnTe, AlGaAs, GaN, $SiO_2$, $Al_2O_3$, $Si_3N_4$ or $TiO_2$.

16. The optoelectronic device according to claim 7, wherein the second shell comprises a material having a refractive index nD20 smaller than the matrix material.

17. The optoelectronic device according to claim 12, wherein the conversion element comprises a matrix material, and wherein the second shell comprises a material having a refractive index nD20 larger than the matrix material.

18. The optoelectronic device according to claim 12, wherein the conversion element comprises a matrix material, and wherein the second shell comprises a material having a refractive index nD20 smaller than the matrix material.

* * * * *